United States Patent
Park et al.

(10) Patent No.: US 9,508,549 B2
(45) Date of Patent: Nov. 29, 2016

(54) METHODS OF FORMING ELECTRONIC DEVICES INCLUDING FILLING POROUS FEATURES WITH A POLYMER

(71) Applicants: Rohm and Haas Electronic Materials LLC, Marlborough, MA (US); Dow Global Technologies LLC, Midland, MI (US)

(72) Inventors: Jong Keun Park, Shrewsbury, MA (US); Phillip D. Hustad, Natick, MA (US); Emad Aqad, Northborough, MA (US); Mingqi Li, Shrewsbury, MA (US); Cheng-Bai Xu, Southborough, MA (US); Peter Trefonas, III, Medway, MA (US); James W. Thackeray, Braintree, MA (US)

(73) Assignees: Dow Global Technologies LLC, Midland, MI (US); Rohm and Haas Electronic Materials LLC, Marlborough, MA (US)

(*) Notice: Subject to any disclaimer, the term of this patent is extended or adjusted under 35 U.S.C. 154(b) by 0 days.

(21) Appl. No.: 14/972,522

(22) Filed: Dec. 17, 2015

(65) Prior Publication Data
US 2016/0189953 A1 Jun. 30, 2016

Related U.S. Application Data

(60) Provisional application No. 62/096,907, filed on Dec. 26, 2014.

(51) Int. Cl.
*H01L 21/02* (2006.01)

(52) U.S. Cl.
CPC ..... *H01L 21/02359* (2013.01); *H01L 21/0212* (2013.01); *H01L 21/02118* (2013.01); *H01L 21/02203* (2013.01)

(58) Field of Classification Search
CPC .................. H01L 21/02359; H01L 21/02118
See application file for complete search history.

(56) References Cited

U.S. PATENT DOCUMENTS 6,962,965 B2  11/2005 Yeager
7,148,296 B2  12/2006 Zarnoch et al.
(Continued)

OTHER PUBLICATIONS

Frot, et al, "Application of the protection/deprotection strategy to the science of porous materials", Advanced Materials, 2011, pp. 2828-2832, vol. 23.

*Primary Examiner* — Michael Jung
(74) *Attorney, Agent, or Firm* — Jonathan D. Baskin

(57) ABSTRACT

Methods of forming an electronic device comprise: (a) providing a semiconductor substrate comprising a porous feature on a surface thereof; (b) applying a composition over the porous feature, wherein the composition comprises a polymer and a solvent, wherein the polymer comprises a repeat unit of the following general formula (I):

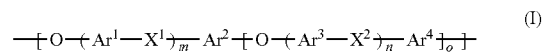

wherein: $Ar^1$, $Ar^2$, $Ar^3$ and $Ar^4$ independently represent an optionally substituted divalent aromatic group; $X^1$ and $X^2$ independently represent a single bond, —O—, —C(O)—, —C(O)O—, —OC(O)—, —C(O)NR$^1$—, —NR$^2$C(O)—, —S—, —S(O)—, —SO$_2$— or an optionally substituted $C_{1-20}$ divalent hydrocarbon group, wherein $R^1$ and $R^2$ independently represent H or a $C_{1-20}$ hydrocarbyl group; m is 0 or 1; n is 0 or 1; and o is 0 or 1; and (c) heating the composition; wherein the polymer is disposed in pores of the porous feature. The methods find particular applicability in the manufacture of semiconductor devices for forming low-k and ultra-low-k dielectric materials.

12 Claims, 1 Drawing Sheet

(56) References Cited

U.S. PATENT DOCUMENTS

| | | |
|---|---|---|
| 7,226,980 B2 | 6/2007 | Yeager |
| 7,329,708 B2 | 2/2008 | Birsak et al. |
| 7,517,633 B2 | 4/2009 | Takei et al. |
| 7,595,367 B2 | 9/2009 | Carrillo et al. |
| 7,655,734 B2 | 2/2010 | Zarnoch et al. |
| 8,007,979 B2 | 8/2011 | Takei et al. |
| 2007/0042609 A1* | 2/2007 | Senkevich ........ H01L 21/02118 438/778 |
| 2012/0329273 A1* | 12/2012 | Bruce ............... H01L 21/02203 438/653 |
| 2013/0189533 A1 | 7/2013 | Okuyama et al. |
| 2014/0272722 A1 | 9/2014 | Nakafuji et al. |
| 2016/0185984 A1 | 6/2016 | Aqad et al. |

* cited by examiner

METHODS OF FORMING ELECTRONIC DEVICES INCLUDING FILLING POROUS FEATURES WITH A POLYMER

This application claims the benefit of priority under 35 U.S.C. §119(e) to U.S. Provisional Application No. 62/096,907, filed Dec. 26, 2014, the entire contents of which are incorporated herein by reference.

FIELD

The invention relates generally to the manufacture of electronic devices. More specifically, this invention relates to methods of forming electronic devices that involve filling pores of a porous feature on a semiconductor substrate. The methods have particular applicability to semiconductor device manufacturing, for example, in processes making use of porous dielectric materials.

BACKGROUND OF THE INVENTION

Advances in integrated circuit technology have reduced the spacing between metal lines on a given layer and between interconnected lines in different layers of an integrated circuit. Such reduced spacing between metal lines results in an increase in capacitive coupling between nearby conductive traces, causing problems such as greater crosstalk and higher capacitive losses. In an effort to address these issues, low-k and ultra-low k (ULK) dielectric materials have been developed as a replacement for conventional dielectric materials used between conductors on a given layer and between layers. These materials can significantly reduce capacitive coupling between the conductors as compared to conventional dielectric materials.

One class of proposed materials relies on the dielectric constant of air (1.001) to achieve their low-k or ULK properties. With these materials, a porous dielectric layer is formed on the semiconductor surface. The effective dielectric constant of the material can be increasingly reduced with an increase in total pore volume of pores in the layer. However, at the same time the pores reduce the dielectric constant of the material, they undesirably also decrease the mechanical strength and stability of the layer, making it susceptible to damage during subsequent processing, for example, during patterning, deposition, chemical mechanical planarization or other processes. In addition, owing to their porous nature, the materials can be highly sensitive to contact with chemicals during subsequent processing such that device failure can result.

In an effort to address these problems, techniques of filling the pores with a sacrificial organic polymer have been proposed for purposes of providing mechanical strength during subsequent processing before the polymer is removed. Frot et al, *Adv. Mater.* 2011, 23, 2828-2832, describes such a process using PMMA-type, polystyrene-type, poly(propylene oxide) derivative or poly(ethylene oxide) derivative polymers. Known pore-filling materials can have poor thermal stability at elevated temperatures typically used for wafer processing. The inventors have recognized the desirability of a pore-filling composition having one or more of: good polymer flexibility and flow characteristics for a substantially void-free pore-fill, and good thermal stability at elevated process temperatures to avoid premature thermal decomposition during treatment and possible reliability problems resulting therefrom.

Accordingly, there is a continuing need for improved pore-filling compositions and methods which address one or more problems associated with the state of the art.

SUMMARY OF THE INVENTION

Provided are methods of forming an electronic device. The methods comprise: (a) providing a semiconductor substrate comprising a porous feature on a surface thereof; (b) applying a composition over the porous feature, wherein the composition comprises a polymer and a solvent, wherein the polymer comprises a repeat unit of the following general formula (I):

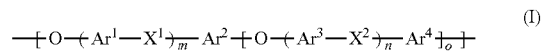

wherein: $Ar^1$, $Ar^2$, $Ar^3$ and $Ar^4$ independently represent an optionally substituted divalent aromatic group; $X^1$ and $X^2$ independently represent a single bond, —O—, —C(O)—, —C(O)O—, —OC(O)—, —C(O)NR$^1$—, —NR$^2$C(O)—, —S—, —S(O)—, —SO$_2$— or an optionally substituted $C_{1-20}$ divalent hydrocarbon group, wherein $R^1$ and $R^2$ independently represent H or a $C_{1-20}$ hydrocarbyl group; m is 0 or 1; n is 0 or 1; and o is 0 or 1; and (c) heating the composition; wherein the polymer is disposed in pores of the porous feature.

The terminology used herein is for the purpose of describing particular embodiments only and is not intended to be limiting of the invention. As used herein, "Mw" means weight average molecular weight. "Mn" means number average molecular weight. "PDI" means polydispersity or polydispersity index=Mw/Mn. "Alkyl" includes linear, branched and cyclic alkyl, "alkenyl" includes linear, branched and cyclic alkenyl and "alkynyl" includes linear and branched alkynyl, unless otherwise specified or indicated by context. Aromatic groups can be substituted or contain heteroatoms, and include single aromatic rings such as phenyl or pyridyl, fused aromatic rings such as naphthyl, anthracenyl, pyrenyl, or quinolinyl, and fused ring systems having both aromatic and non-aromatic rings such as 1,2,3,4-tetrahydronaphthalene, 9,10-dihydroanthracene, or fluorene, and their various valency forms. The singular forms "a", "an" and "the" are intended to include the plural forms as well, unless the context clearly indicates otherwise.

BRIEF DESCRIPTION OF THE DRAWINGS

The present invention will be described with reference to the following drawings, in which like reference numerals denote like features, and in which.

DETAILED DESCRIPTION

Figure 1A:
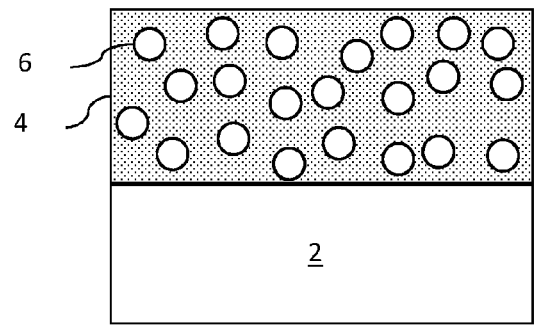
FIG. 1A-D illustrates an exemplary pore-fill process flow in accordance with the invention.

The methods of the invention involve application of a composition containing an aromatic resin over a porous feature on a surface of a substrate for purposes of filling the pores. The composition at least partially fills the pores. Preferably, the composition can substantially or completely fills the pores. By substantially filling the pores is meant filling greater than 50%, preferably greater than 80%, greater than 90% or greater than 95% of the open pore volume. Reference herein to the filling of pores means at least partial filling unless otherwise indicated.

The pore-fill compositions useful in the invention include a polymer and a solvent, and may include one or more optional components. The polymer includes one or more repeat unit of the following general formula (I):

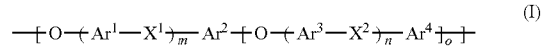

wherein: $Ar^1$, $Ar^2$, $Ar^3$ and $Ar^4$ independently represent an optionally substituted divalent aromatic group, preferably with optionally substituted phenylene being particularly preferred; $X^1$ and $X^2$ independently represent a single bond, —O—, —C(O)—, —C(O)O—, —OC(O)—, —C(O)NR$^1$—, —NR$^2$C(O)—, —S—, —S(O)—, —SO$_2$— or an optionally substituted $C_{1-20}$ divalent hydrocarbon group, for example, $C_{1-20}$ alkylene or $C_{1-20}$ fluoroalkylene, wherein $R^1$ and $R^2$ independently represent H or an optionally substituted $C_{1-20}$ hydrocarbyl group, for example, $C_{1-20}$ alkyl or $C_{1-20}$ fluoroalkyl, preferably H, $C_{1-5}$ alkyl or $C_{1-5}$ fluoroalkyl; m is 0 or 1; n is 0 or 1; and o is 0 or 1. Preferably, $Ar^1$, $Ar^2$, $Ar^3$ and $Ar^4$ independently represent optionally substituted phenylene, preferably substituted with $C_{1-5}$ alkyl. Any of $Ar^1$, $Ar^2$, $Ar^3$ and $Ar^4$ can be the same or different. Preferably, $X^1$ and $X^2$ independently represent a single bond, —O—, —C(O)—, or an optionally substituted $C_{1-20}$ divalent hydrocarbon group, for example, linear or branched $C_{1-11}$ alkyl or fluoroalkyl. Preferably, m and o are 0 and $Ar^2$ represents optionally substituted phenylene.

As used herein, "aromatic group" and "aryl group" are used interchangeably and refer to an aromatic ring system, which may be carbocyclic, heterocyclic, or a combination thereof. The term "aromatic group" includes: single aromatic rings such as phenyl or pyridyl; fused aromatic rings such as naphthyl, anthracenyl, pyrenyl, or quinolinyl; and fused ring systems having both aromatic and non-aromatic rings such as 1,2,3,4-tetrahydronaphthalene, 9,10-dihydroanthracene, or fluorene. Optionally, the aromatic group may be substituted. As used herein, the term "substituted" alkyl, alkenyl, alkynyl, aralkyl, or aryl group refers to any alkyl, alkenyl, alkynyl, aralkyl, or aryl group having one or more of its hydrogens replaced with one or more substituents selected from $C_{1-30}$ alkyl, $C_{2-30}$ alkenyl, $C_{7-30}$ aralkyl, $C_{4-30}$ aryl, —OR, —$C_{1-30}$ alkylene-OR, and —$C_{1-30}$ alkylidene-OR; wherein R is selected from H, $C_{1-30}$ alkyl, $C_{2-30}$ alkenyl, and $C_{4-30}$ aryl. Preferably, "substituted" alkyl, alkenyl, alkynyl, aralkyl, or aryl moiety refers to any alkyl, alkenyl, alkynyl, aralkyl, or aryl moiety having one or more of its hydrogens replaced with one or more substituents selected from $C_{1-20}$ alkyl, $C_{2-20}$ alkenyl, $C_{7-30}$ aralkyl, $C_{4-20}$ aryl, —OR, —$C_{1-20}$ alkylene-OR, and —$C_{1-20}$ alkylidene-OR; and more preferably from $C_{1-10}$ alkyl, $C_{2-12}$ alkenyl, $C_{7-30}$ aralkyl, $C_{4-20}$ aryl, —OR, —$C_{1-20}$ alkylene-OR, and —$C_{1-20}$ alkylidene-OR. Preferably, R is selected from H, $C_{1-20}$ alkyl, $C_{2-20}$ alkenyl and $C_{4-20}$ aryl, more preferably H, $C_{1-10}$ alkyl, and $C_{4-20}$ aryl, and most preferably H.

A wide variety of aromatic groups may be used for each of $Ar^1$, $Ar^2$, $Ar^3$ and $Ar^4$, which may be unsubstituted or substituted. Such unsubstituted aromatic groups have from 4 to 40 carbons, preferably from 4 to 35 carbons, and more preferably from 4 to 30, 5 to 30 or 6 to 30 carbons. Suitable aromatic groups include, but are not limited to: phenyl, biphenyl, naphthalenyl, anthracenyl, phenanthrenyl, pyrenyl, tetracenyl, triphenylenyl, tetraphenyl, benzo[f]tetraphenyl, benzo[m]tetraphenyl, benzo[k]tetraphenyl, pentacenyl, perylenyl, benzo[a]pyrenyl, benzo[e]pyrenyl, benzo[ghi]perylenyl, coronenyl, quinolonyl, 7,8-benzoquinolinyl, fluorenyl, and 12H-dibenzo[b,h]fluorenyl, each of which may by unsubstituted or substituted. Preferred aromatic moieties include: phenyl, naphthalenyl, anthracenyl, phenanthrenyl, pyrenyl, tetracenyl, triphenylenyl, tetraphenyl, benzo[f]tetraphenyl, benzo[m]tetraphenyl, benzo[k]tetraphenyl, pentacenyl, perylenyl, benzo[a]pyrenyl, benzo[e]pyrenyl, benzo[ghi]perylenyl, coronenyl, and fluorenyl.

The polymer may have any number of repeat units of general formula (I), for example, a=2 to 500, a=3 to 250 or a=3 to 100, wherein "a" is the number of repeat units of general formula (I) in the polymer.

Suitable repeat units of general formula (I) include, for example, the following:

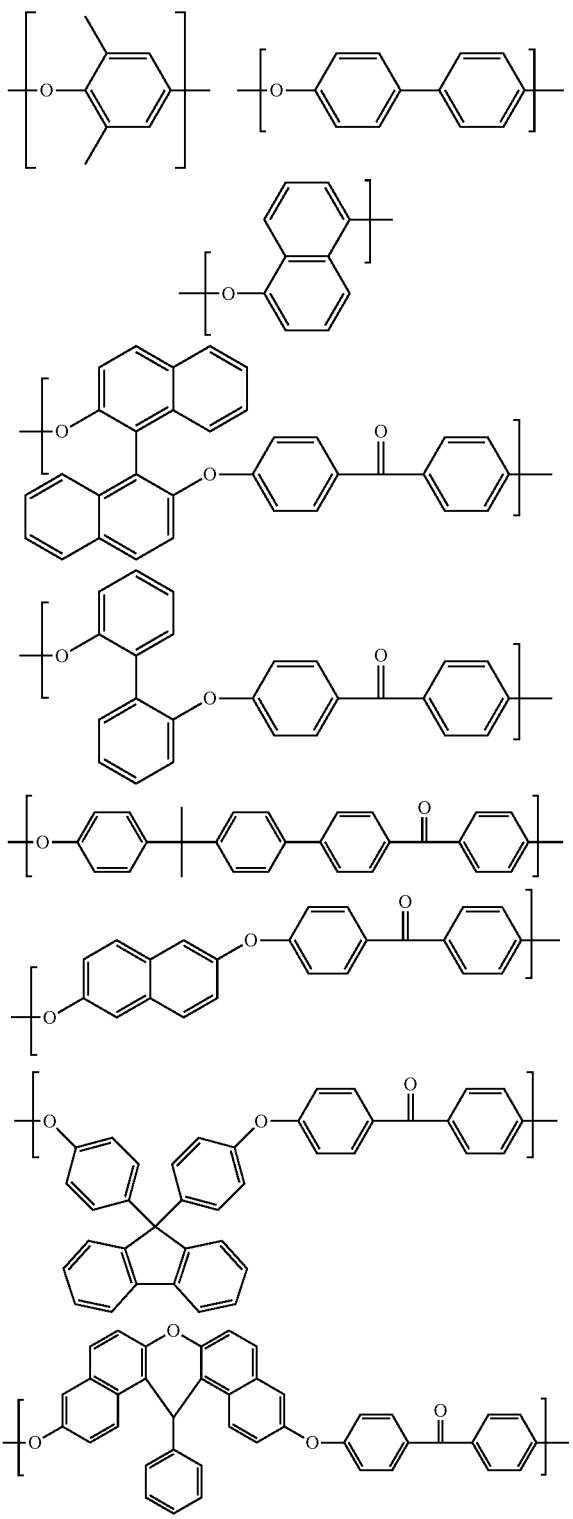

Polymers of the invention may comprise a single repeat unit or two or more different repeat units of formula (I) and optionally one or more unit not of formula (I). Preferably, the present polymers comprise a single unit of formula (I) or two different units of formula (I). Exemplary polymers comprising two different repeat units of the invention include those having the following repeat units:

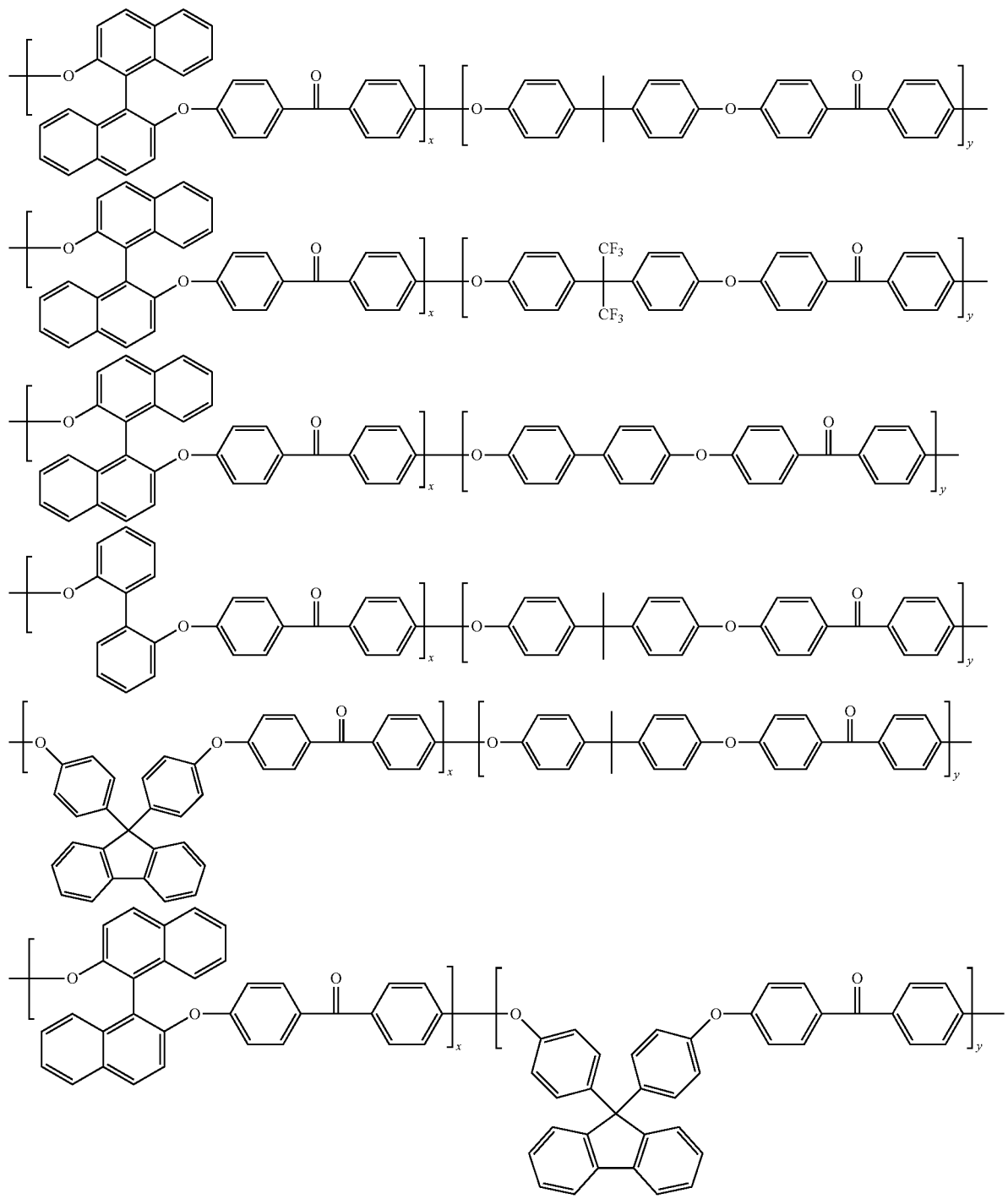

wherein x and y represent the number of each repeat unit and are integers independently selected from 1 to 499, and wherein x+y=2 to 500.

The end groups of the polymer can be chosen, for example, from hydrogen atom, hydroxy and haloaryl. Preferably, the end groups are capped. It is believed that inclusion of particular endcapping groups on the polymer can provide improved thermal stability and/or improved solubility in the formulation solvent. This can be useful, for example, to prevent polymer decomposition when the polymer-filled pores are subject to elevated process temperatures. The endcapping group can include but is preferably free of polymerizable vinyl groups and/or hydroxyl groups. Suitable endcapping groups include, for example, optionally substituted $C_{4-20}$ aryl, optionally substituted $C_{4-20}$ O-aryl, optionally substituted $C_{1-30}$ alkyl, optionally substituted $C_{1-30}$ O-alkyl, optionally substituted $C_{2-30}$ alkenyl, optionally substituted $C_{2-30}$ O-alkenyl, optionally substituted $C_{2-30}$ alkynyl, optionally substituted $C_{2-30}$ O-alkynyl, optionally substituted $C_{7-30}$ aralkyl and optionally substituted $C_{7-30}$ O-aralkyl.

Suitable exemplary endcapping groups are chosen from the following:

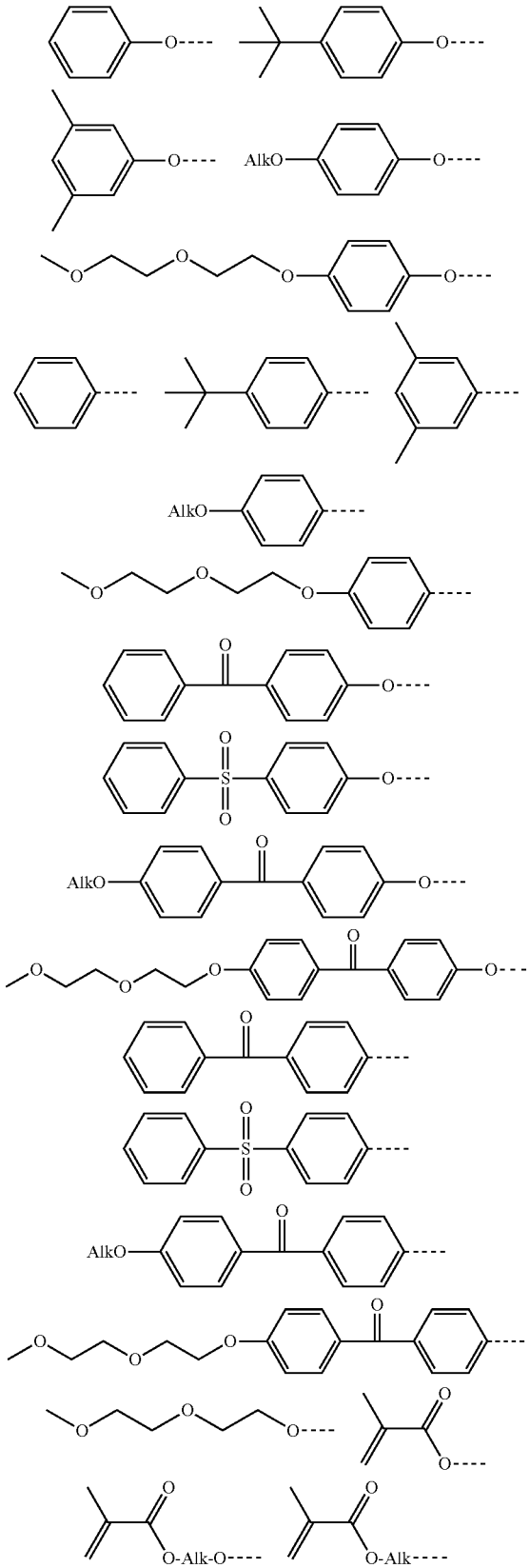

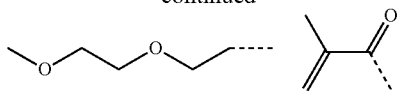

wherein "Alk" is an alkyl group or a fluoroalkyl group, for example, $C_{1-10}$ alkyl or $C_{1-10}$ fluoroalkyl.

The polymer can further include one or more divalent linking group within the polymer backbone. It is believed that the presence of particular divalent linking groups in the polymer can impart one or more beneficial property to the polymer, for example, lowering the glass transition temperature ($T_g$) of the polymer and/or improving solubility of the polymer in the solvent of the composition. The divalent linking group can, for example, be chosen from —O— and $C_{1-20}$ divalent fluorinated or non-fluorinated hydrocarbon groups, optionally containing —O— within the polymer backbone. The divalent linking group can be chosen, for example, from groups of the following general formula (II):

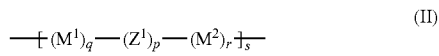

wherein: $M^1$ and $M^2$ are independently chosen from divalent aromatic groups and divalent aromatic oxide groups, preferably $C_{4-20}$ divalent aromatic or aromatic oxide groups; $Z^1$ represents —C($R^3$)($R^4$)—, —O—, —C(O)—, —S(O)— or —Si($R^5$)($R^6$)—, wherein $R^3$ and $R^4$ are independently chosen from hydrogen, hydroxyl, $C_{1-5}$ alkyl and fluoroalkyl, and $R^5$ and $R^6$ are independently chosen from $C_{1-5}$ alkyl and fluoroalkyl and $C_{4-25}$ aryl and fluoroaryl; p is an integer from 0 to 5; q is 0 or 1; r is 0 or 1; p+q+r>0; and s is an integer from 1 to 50. Preferably, the spacer is chosen from —O—, —C($H_2$)—, —C($CH_3$)$_2$—, or a group chosen from the following:

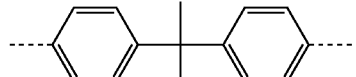

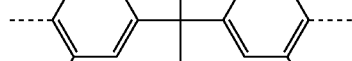

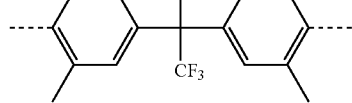

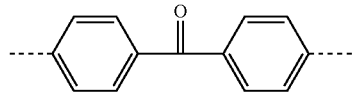

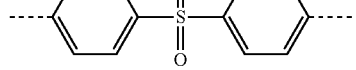

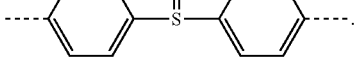

Preferably, the polymer has a decomposition temperature that is sufficiently high such that the polymer is stable at elevated temperatures to which it is exposed during subsequent processing, but not excessively high where the polymer is a sacrificial material which is eventually removed from the pores. The polymer is preferably stable under air and nitrogen atmosphere at a temperature of 350° C. or higher, preferably 375° or higher, and more preferably 400° C. or higher, for a heating time of 1 minute or more, preferably 5 minutes or more, more preferably 20 minutes or more, and even more preferably one hour or more. Preferably, the polymer exhibits a weight loss of less than 5% under nitrogen atmosphere at a temperature of 400° C., 420° C. or 450° C., as determined by Thermal Gravimetric Analysis at a heating rate of 10° C./min from room temperature. Also preferably, the polymer exhibits a weight loss of less than 10% under nitrogen atmosphere at a temperature of 420° C., 450° C. or 500° C., as determined by Thermal Gravimetric Analysis at a heating rate of 10° C./min from room temperature.

Suitable polymers for use in the compositions include, for example, the following:

(P-1)
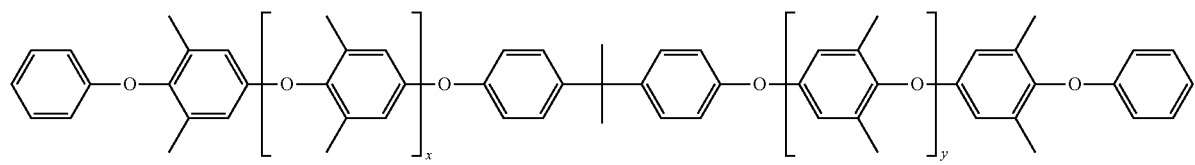

(P-2)
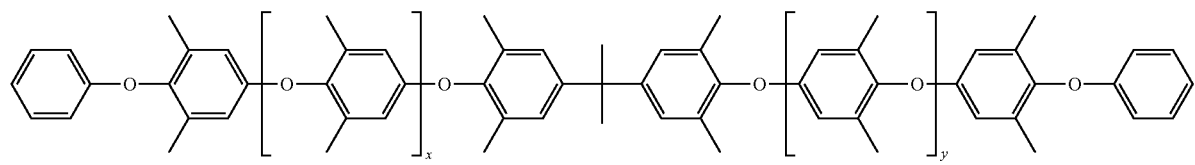

(P-3)
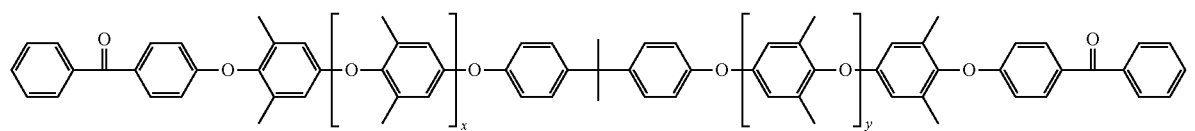

(P-4)
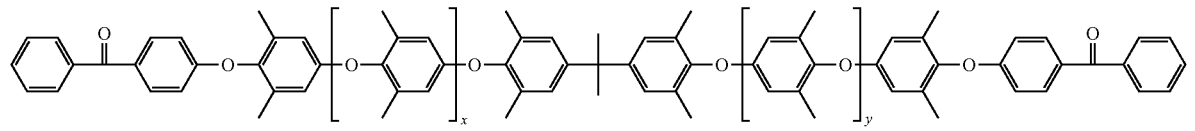

(P-5)
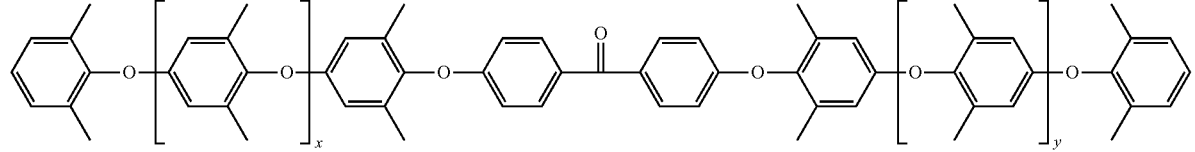

(P-6)
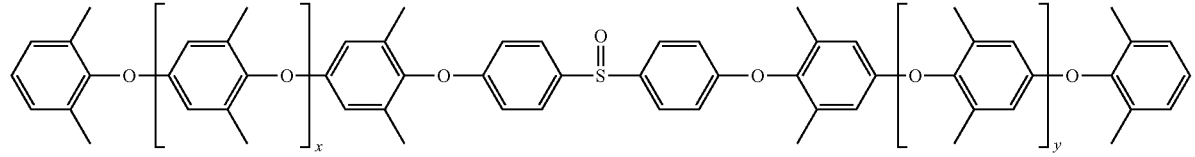

(P-7)
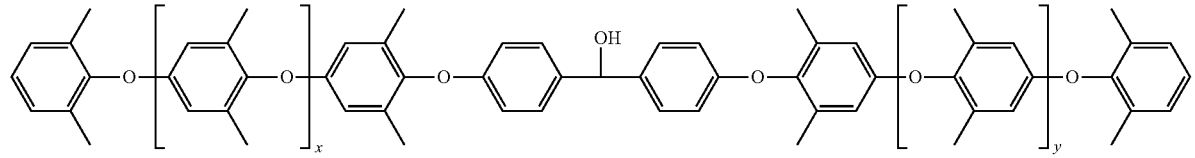

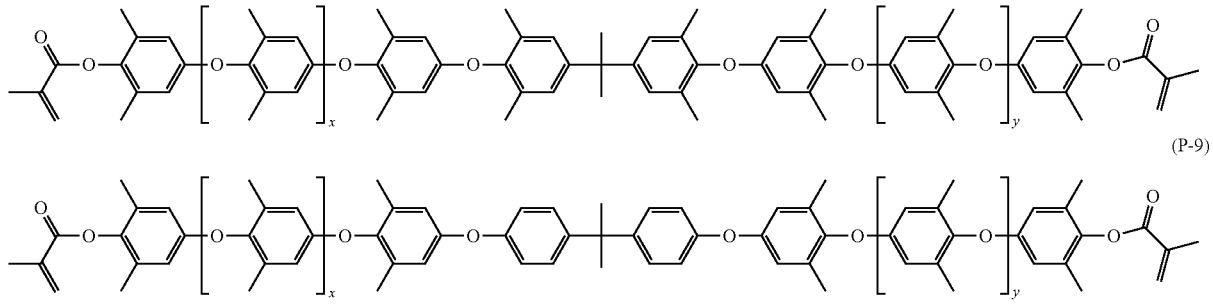

wherein x and y in the above structures represent the number of repeat units and are independently chosen, for example, from 3 to 100, preferably, from 5 to 50.

Typically, the polymer is present in the composition in an amount from 50 to 100 wt %, for example, from 80 to 100 wt %, from 90 to 100 wt %, from 95 to 100 wt % or 100 wt %, based on total solids of the composition. The polymer is typically present in the composition in an amount of from 1 to 20 wt %, for example, from 1 to 10 wt % or from 1 to 5 wt %, based on the total composition.

Typically, the polymers of the invention have a weight average molecular weight ($M_w$) of ≥1000, such as from 1000 to 50000. It is believed that lower molecular weight polymers allow for easier filling of narrow pores as a result of their less bulky nature as compared with higher molecular weight polymers. The polymer preferably has a polydispersity index (PDI) of less than 2, and more preferably less than 1.5 or lower. It is believed that a lower PDI for the polymer improves the ability to fill the pores for the same reasons described above with respect to molecular weight.

Preferably, the glass transition temperature ($T_g$) of the polymer is 250° C. or lower, more preferably 200° C. or lower. As referenced herein, the glass transition temperature is as determined by differential scanning calorimetry (DSC). A lower $T_g$ is believed desirable to better allow the polymer to flow into the pores.

It will be appreciated that blends of polymers may be used in the present compositions, such as a blend of two or more polymers of general formula (I) or a blend comprising one or more polymers of general formula (I) and one or more other polymer.

Aromatic polymers of the invention may be prepared by a variety of methods. An exemplary scheme for preparing a first polymer having a methacrylate endcapping group is shown below:

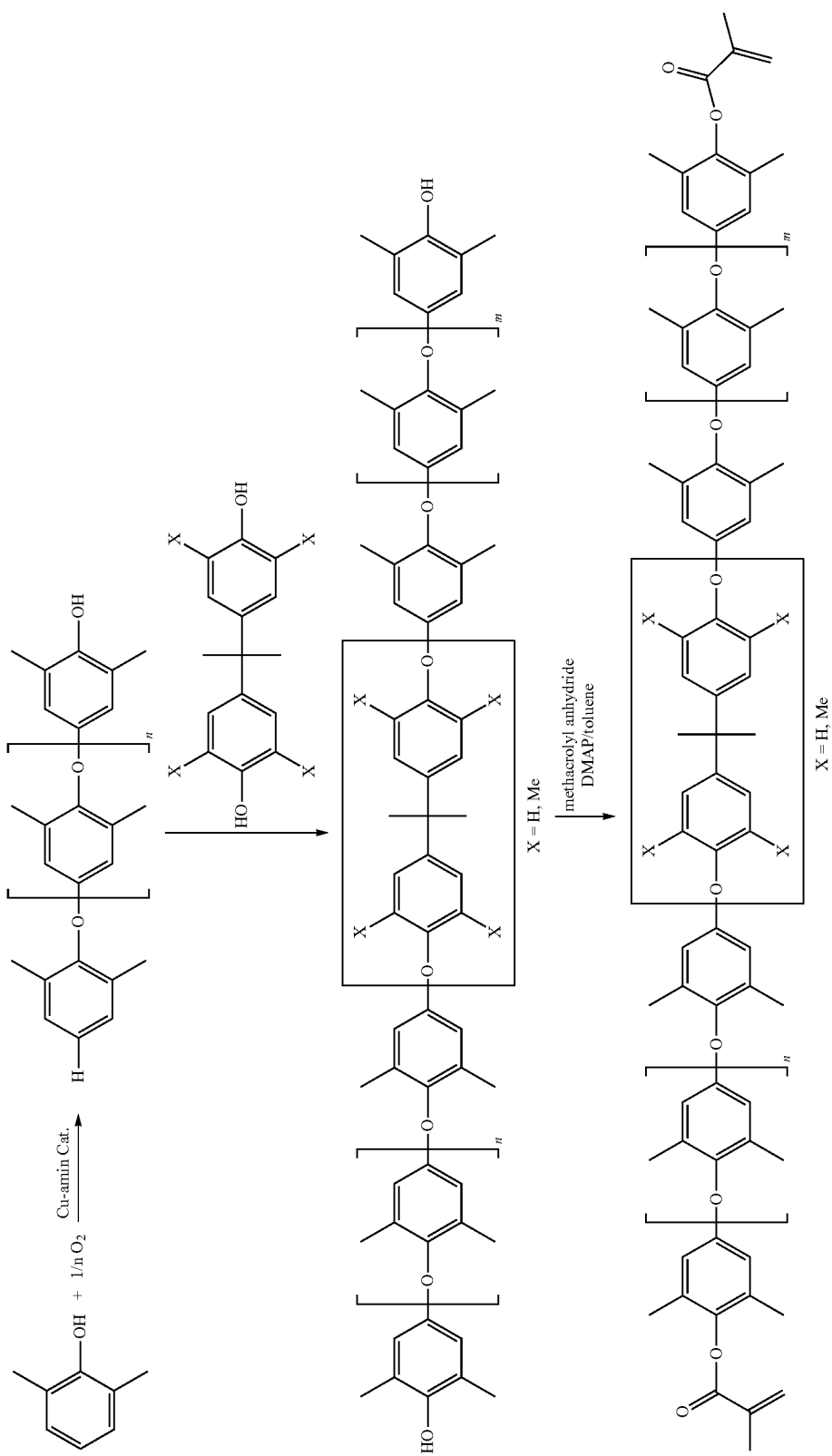

A preferred method for the preparation of the endcapped polymers comprises the reaction of isolated phenol-terminated polymer or haloaryl-terminated polymer with an endcapping reagent. An exemplary such scheme is shown below. In this example the O-alkylation reaction of a phenol-terminated polymer P1 with 4-fluorobenzophenone (capping reagent) produces the corresponding endcapped polymer PFP-1:

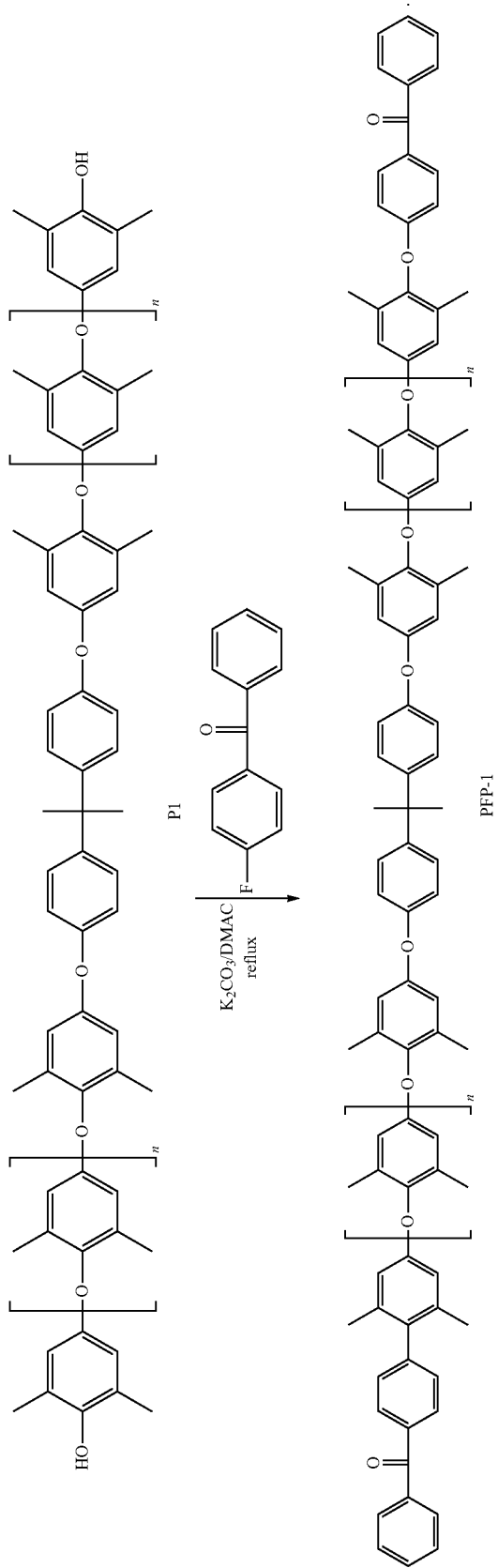

A further preferred method for preparing the endcapped polymers is a one-pot process for the polymerization and capping reactions. Such method is exemplified in the scheme below by the preparation of endcapped polymer PFP-2, using 4,4'-difluorobenzophenone/bisphenol-A with a molar ratio greater than 1. The polymerization mixture contains a monofunctional phenolic capping reagent:

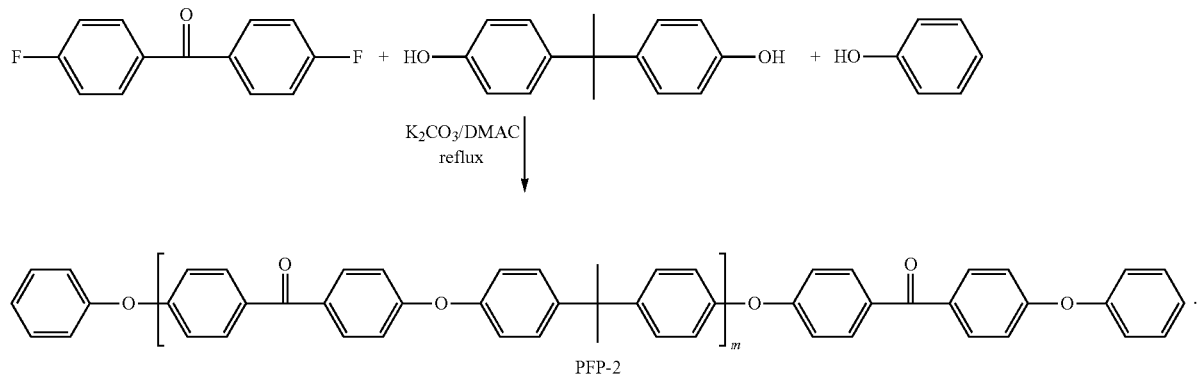

PFP-2

The polymers of the invention can be used without further purification, but are preferably further purified. Such purification can remove non-volatile impurities such as metals, as well as volatile impurities such as residual unreacted monomers, oligomers, catalysts and solvents used in the polymer synthesis. Suitable purification techniques are known in the art and include, for example, one or more of fractionation, precipitation, re-precipitation, reverse precipitation and extraction. Preferably, the polymer is 99.9% free of volatile impurities including residual unreacted monomers, oligomers, catalysts and solvents used in the polymer synthesis, based on the total weight of the polymer.

The pore-fill composition further includes a solvent which can include a single solvent or a solvent mixture. Suitable solvent materials to formulate and cast the pore-fill composition exhibit very good solubility characteristics with respect to the non-solvent components of the pore-fill composition, but do not appreciably dissolve the underlying relief image or other materials of the substrate surface coming into contact with the pore-fill composition. The solvent can be chosen from water, aqueous solutions, organic solvents and mixtures thereof, with organic solvents being typical. Suitable organic solvents for the pore-fill composition include, for example: alcohols such as straight, branched or cyclic $C_4$-$C_9$ monohydric alcohol such as 1-butanol, 2-butanol, isobutyl alcohol, tert-butyl alcohol, 2-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; esters such as ethyl lactate, methyl 2-hydroxyisobutyrate, propylene glycol methyl ether acetate, alkyl esters such as alkyl acetates such as n-butyl acetate, propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as cyclohexanone, 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; aromatic hydrocarbons such as anisole, toluene, xylene and mesitylene; ethers such as isopentyl ether, propylene glycol methyl ether and dipropylene glycol monomethyl ether; lactones such as gamma-butyrolactone and gamma valerolactone; and mixtures containing one or more of these solvents. Of these organic solvents, alcohols, aliphatic hydrocarbons and ethers are preferred. The solvent component of the pore-fill composition is typically present in an amount of from 80 to 99 wt %, more typically, from 90 to 99 wt % or from 95 to 99 wt %, based on the total weight of the pore-fill composition.

The pore-fill composition may include one or more optional additives including, for example, a surfactant and/or antioxidant. While any suitable ionic or non-ionic surfactant may be used, such surfactants are typically non-ionic. Exemplary non-ionic surfactants are those containing an alkyleneoxy linkage, such as ethyleneoxy, propyleneoxy, or a combination of ethyleneoxy and propyleneoxy linkages. Surfactants if used are typically present in the pore-fill composition in an amount of from 0.01 to 5 wt % based on total solids of the pore-fill composition.

An antioxidant can be added to prevent or minimize oxidation of organic materials in the pore-fill composition. Suitable antioxidants include, for example, phenol-based antioxidants, antioxidants composed of an organic acid derivative, sulfur-containing antioxidants, phosphorus-based antioxidants, amine-based antioxidants, antioxidants composed of an amine-aldehyde condensate and antioxidants composed of an amine-ketone condensate. The antioxidants if used are typically present in the pore-fill composition in an amount of from 0.01 to 10 wt % based on total solids of the pore-fill composition.

Preferably, the pore-fill composition is free of crosslinkers and preferably the polymer does not undergo crosslinking reaction during use. Crosslinkers can be thermally unstable and/or can sublime, causing outgassing and void formation during subsequent processing. The pore-fill composition preferably does not exhibit outgassing during subsequent processing, for example, preferably exhibiting no mass loss when baked at 350° C. for 5 minutes in nitrogen atmosphere. For low outgassing characteristics, the pore-fill composition is preferably free of volatile impurities such as residual unreacted monomers, catalysts and solvents used in polymer synthesis.

The pore-fill compositions can be prepared following known procedures. For example, the compositions can be prepared by dissolving the solid components of the composition in the solvent components. The desired total solids content of the compositions will depend on factors such as pore size, pore geometry, pore volume and desired viscosity. Typically, the solids content of the pore-fill compositions is from 1 to 20 wt %, for example, from 1 to 10 wt % or from 1 to 5 wt %, based on the total composition.

The compositions of the invention are preferably purified to remove non-volatile impurities such as metals. Suitable purification techniques are known in the art and include, for example, filtration and/or treating the composition with ion exchange resin. Suitable ion-exchange resins for removal of ionic metal contaminants include, for example, AMBERLITE™, AMBERJET™, DOWEX™, MARATHON™ and MONOSPHERE™ ion exchange resins (The Dow Chemical Company, Midland, Mich. USA). The ion exchange resin can be used, for example, in a slurry, sequential bed or mixed bed column. Preferably, the composition contains less than 50 ppb total metal impurities, more preferably less than 10 ppb total metal impurities.

Methods of the invention will now be described with reference to FIG. 1A-D. FIG. 1A depicts in cross-section a semiconductor substrate 2. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon, and may have one or more layers and patterned features formed on a surface thereof. Layers forming part of the substrate may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers such as single-crystal silicon, carbon layers and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating, or a liquid coating technique such as spin-coating.

The uppermost layer of the substrate includes a porous layer 4, typically a dielectric layer containing pores 6, for example, a low-k or ULK dielectric layer. The pores can be very narrow in width, for example 20 nm or less, 10 nm or less, or 5 nm or less in width. The pores are of a random pattern, as opposed to a predefined pattern such as duplicated through photolithography using a patterned photomask. The pores can, for example, be generated by removal of porogens from a layer formed from a composition containing the sacrificial porogens. The pores can be in the form of an interconnected network. Suitable porous layers and their methods of formation are known in the art and described, for example, in U.S. Patent Publication Nos. U.S. Pat. No. 6,391,932B1, U.S. Pat. No. 6,420,441B1, U.S. Pat. No. 7,256,127B2, US2013/0017682A1 and US2014/0363950A1. The porous layer can be formed, for example, by spin-coating a silicon-containing material containing porogens which are subsequently removed, or by plasma-enhanced CVD such as Novellus Coral or Applied Materials Black Diamond dielectric layer deposition. The thickness of the porous layer is typically from 25 nm to 1000 nm.

Figure 1B:
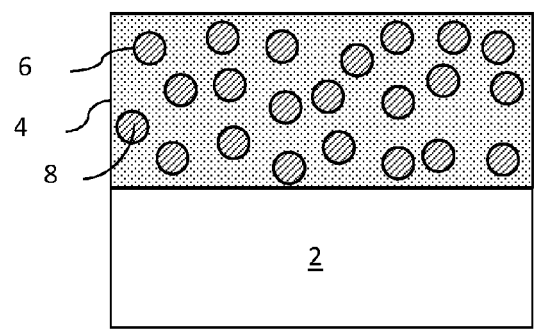

As shown in FIG. 1B, the pore-fill composition 8 as describe herein is applied to the wafer surface over the porous feature 4. The pore-fill composition can be applied to the substrate by spin-coating, dipping, roller-coating or other conventional coating technique. Of these, spin-coating is typical and preferred. For spin-coating, the solids content of the pore-fill composition can be adjusted to provide a desired film thickness based upon the specific coating equipment utilized, the viscosity of the solution, the speed of the coating tool and the amount of time allowed for spinning. The desired coated thickness of the pore-fill composition will depend, for example, on the thickness of the porous feature and volume of the pores to be filled. A typical thickness for the pore-fill composition is from about 200 to 3000 Å.

The pore-fill composition is typically next softbaked at a temperature and time to evaporate residual solvent from the layer. The softbake can be conducted with a hotplate or oven, with a hotplate being typical. The softbake can, for example, be conducted on a hotplate of a wafer track also used for coating of the pore-fill composition. The softbake temperature and time will depend, for example, on the particular composition and thickness of the pore-fill composition. The softbake is typically conducted at a temperature of from about 90 to 200° C., and a time of from about 30 to 120 seconds.

Heating of the pore-fill composition promotes flow of the polymer into the pores. Depending on the softbake temperature, pore-fill composition and pore dimensions and geometry, partial or complete pore-filling may occur during softbake if the polymer viscosity is sufficiently reduced. If the pores are not sufficiently filled following coating and soft-bake, the composition can be further heated at a temperature that is greater than the softbake temperature and for a time effective to lower the polymer viscosity, allowing it to flow into the pores for substantial or complete filling of the pores, such as greater than 50 vol % or preferably greater than 80 vol % of the total pore volume. This pore-fill bake can be conducted with a hotplate or oven, with a hotplate being typical. The pore-fill bake can, for example, be conducted on a hotplate of a wafer track also used for coating of the pore-fill composition and softbake. The bake temperature and time will depend, for example, on the particular composition and thickness of the softbaked pore-fill composition. The pore-fill bake is typically conducted at a temperature of from about 150 to 400° C., and a time of from about 30 seconds to 10 minutes. The pore-fill bake is typically conducted in an inert atmosphere, for example, in nitrogen or argon. The softbake and pore-fill bake can be conducted in a single process using the same tool, for example, by ramping the temperature from softbaking to pore-fill temperature. Optionally, the pore-fill bake can be conducted without a prior softbake.

The wafer can optionally next be rinsed to remove residual (overburden) pore-fill material from the wafer surface. Typical rinse materials include organic solvents, for example, anisol, 2-heptanone, n-butyl acetate, propylene glycol monomethyl ether acetae (PGMEA), ethyl lactate, cyclohexanone or mixtures thereof.

Figure 1C:
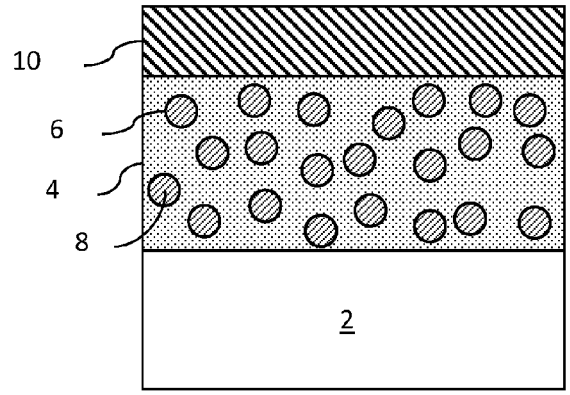
Figure 1D:
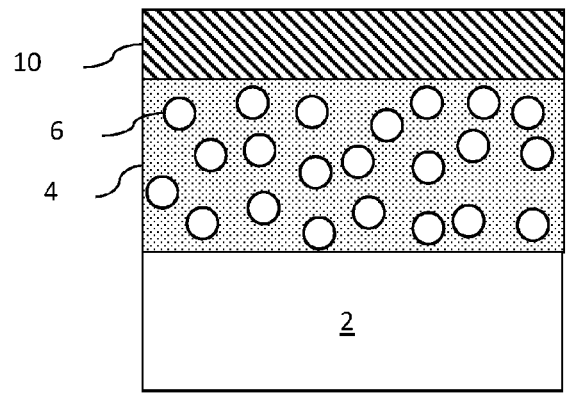

Further processing of the substrate is conducted to form a final device such as a memory or logic device. The further processing can include, for example, one or more of formation of a layer 10 over the substrate as shown in FIG. 1C, etching, polishing, chemical-mechanical planarization (CMP), ion implantation, annealing, CVD, PVD, epitaxial growth, electroplating and lithographic techniques such as DSA and photolithography. A typical process includes etching and metallization, for example, in a dual damascene process. If desired, the pore-fill polymer 8 disposed in the pores can be removed as a sacrificial material thereby opening the pores again as shown in FIG. 1C. Such removal may be desired, for example, to provide a low-k or ULK dielectric layer. Removal of the polymer can be achieved, for example, by heating at a temperature and time to cause decomposition of the pore-fill polymer or by plasma such as hydrogen plasma. The decomposition bake can be conducted on a hotplate or in an oven, and can be conducted in air, inert gas or under vacuum. The decomposition bake temperature and time will depend, for example, on the particular polymer of the pore-fill composition. The decomposition bake is typically conducted at a temperature of 350° C. or more, for example, from 350 to 800° C., from 400 to 700° C. or from 400 to 600° C., and a time of from about 30 seconds to 30 minutes.

The following non-limiting examples are illustrative of the invention.

EXAMPLES

Preparation of Pore-Fill Polymers (PFP)
Pore-Fill Polymer 1 (PFP-1):

NORYL™ SA90 resin (SABIC, Pittsfield, Mass. USA) was used as a starting material. GPC analysis of the polymer showed a weight average molecular weight $M_w$ of 3600 and a polydispersity index $M_w/M_n$ of 1.6 in terms of standard polystyrene. The polymer was fractionated according to the following procedure. A solution of 50 g of the polymer in 150 g of tetrahydrofuran was poured slowly with vigorous stirring into 1.5 g of isopropanol. The resulting precipitate was filtered, washed with 1 liter of isopropyl alcohol, air dried overnight and then dried at 60° C. under vacuum for 48 hours to produce 27 g of fractionated polymer having a weight average molecular weight $M_w$ of 4590 and polydispersity index $M_w/M_n$ of 1.38 in terms of standard polystyrene.

The fractionated polymer P1 was end-capped with benzophenone groups according to the reaction shown in Scheme 1 using the procedure described below to form polymer PFP-1.

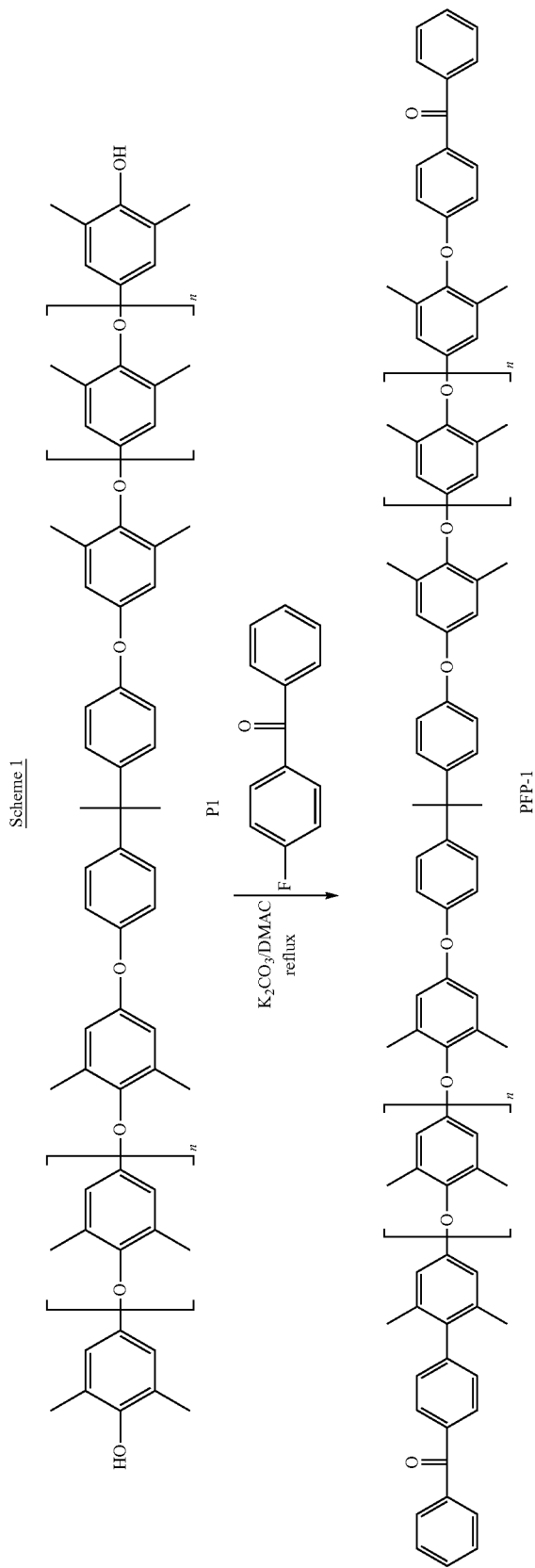

A 1 L 3-neck round-bottom flask equipped with a Dean-Stark trap, condenser and a nitrogen inlet was situated in a silicon oil bath. The fractionated polymer P1 was added to the flask followed by 8.0 g of 4-fluorobenzophenone, 160 ml N,N-dimethylaminoacetamide (DMAC) and 20 ml toluene. The mixture was degassed by bubbling nitrogen gas for 20 minutes. Potassium carbonate ($K_2CO_3$, 15 g) was then added to the mixture and reaction was brought to reflux while the volatile toluene component was collected and removed by the Dean Stark trap. Reflux was continued for 16 hours under nitrogen atmosphere. The reaction mixture was cooled to room temperature, diluted with 50 ml of tetrahydrofuran, filtered to remove inorganic salts and the filtrate was poured slowly into 1500 ml of DI water, the resulting crude polymer was filtered, washed with 0.5 liter of water, air dried for 24 hours and then vacuum dried at 60° C. overnight. The polymer was dissolved in tetrahydrofuran to 30% solids and precipitated into 1500 ml isopropanol. The resulting polymer was filtered and dried. The polymer was dissolved in 100 ml of tetrahydrofuran and reprecipitated by the slow addition of 200 ml of isopropanol. The solid was filtered and dried. Final yield was 21.0 g. GPC analysis of the resulting polymer showed a weight average molecular weight $M_w$ of 4700 and polydispersity $M_w/M_n$ of 1.38 in terms of standard polystyrene.

Pore-Fill Polymer 2 (PFP-02):

Poly(benzophenone-bisphenol-A) (Poly(BPA-PBH)) (PFP-2) was prepared according to the reaction shown in Scheme 2.

Pore-Fill Composition Preparation

Pore-Fill Composition 1 (PFC-1):

Polymer PFP-1 was dissolved in anisol to form a 3.6 wt % solution. The solution was filtered through a Teflon filter having a 0.2 micron pore size to form pore-fill composition PFC-1.

Pore-Fill and Characterization

A silicon wafer coated with PECVD-deposited Black Diamond™ II nano-porous low-k film (Applied Materials) having a porosity of 14.4% and a cured thickness of 1000 Å was provided. Pore-fill composition PFC-1 was spin-coated on the porous film-coated wafer and on a bare silicon monitor wafer at 1500 rpm followed by softbake at 150° C. for 2 minutes to give a polymer thickness of 100 nm, based on the monitor wafer. The porous film-coated wafer was next heated at 300° C. for 5 minutes on a hotplate under nitrogen atmosphere. The wafer was rinsed three times with anisol at 25° C. on a spin-coater for 60 seconds at 2500 rpm to remove residual (overburden) pore-fill material from the wafer surface. The wafer was baked at 200° C. for 5 minutes to remove residual solvent.

Refractive index n was measured for the following: (1) the pore-fill composition-coated monitor wafer following softbake; (2) the porous film-coated wafer prior to coating the pore-fill composition; and (3) the porous film-coated wafer after coating the pore-fill composition and anisol rinse. The measurements were conducted with a J. A. Woollam Co. VUV-VASE VU-302 ellipsometer. Polarization data was collected at three different angles at wavelengths from 620 nm to 1000 nm. The generated data was analyzed and fit against a model to obtain refractive index n values at 633 nm as shown in Table 1.

Scheme 2

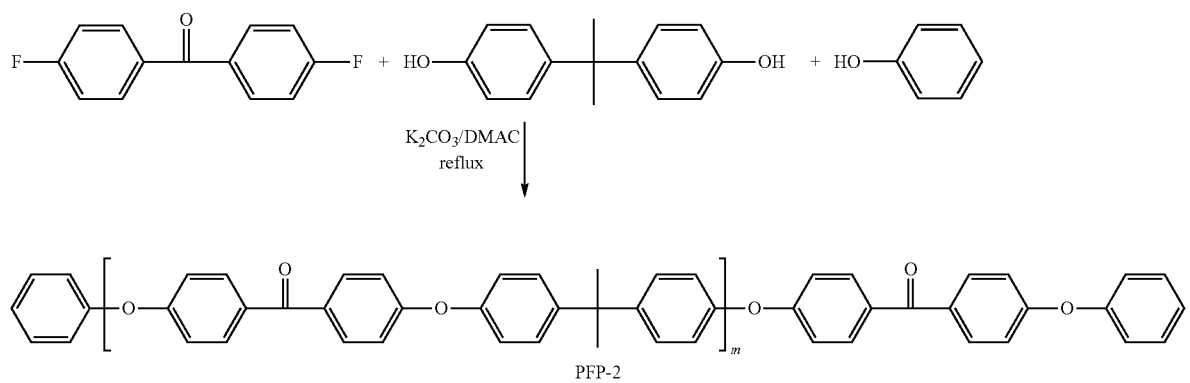

PFP-2

A 1-L 3-neck round-bottom flask equipped with condenser and a nitrogen inlet was situated in a silicon oil bath. 4,4'-Difluorobenzophenone (21.0 g, 96.3 mmol, Aldrich), bisphenol A (20.0 g, 87.6 mmol, Aldrich), phenol (1.64 g, 17.52 mmol), potassium carbonate (36.3 g, 262.8 mmol) and anhydrous N,N-dimethylacetamide (150 mL) were added to the flask and heated to 165° C. (oil bath temperature). After heating for 16 hours under nitrogen atmosphere at 175° C. with continuous stirring, the reaction mixture was filtered to remove insoluble salts. The resultant solution was added to methanol (1 L) to precipitate the polymer. The polymer was isolated by filtration and the wet filter cake was washed with water (1 L) and methanol (1 L). The yield of the vacuum dried Polymer PFP-2 was 35.5 g. GPC analysis of the resulting polymer showed a weight average molecular weight $M_w$ of 10600 and polydispersity $M_w/M_n$ of 2.02 in terms of standard polystyrene.

TABLE 1

| Refractive Index n (633 nm) | | |
| --- | --- | --- |
| Pore-Fill Composition | Porous-Coated Film | Porous-Coated Film after Pore-Fill Coating |
| 1.57 | 1.39 | 1.42 |

The increased refractive index of the porous film before and after treatment with the pore-fill composition indicates the presence of the pore-fill composition polymer in the pores of the porous film.

Thermal Stability Evaluation

Thermal stabilities for the bulk polymers listed in Table 1 were measured by Thermal Gravimetric Analysis (TGA) under a nitrogen atmosphere with a heating rate of 10° C./min. The polymers included polystyrene (Comparative) ($M_w$=17000, $M_w/M_n$=1.05 in terms of standard polystyrene), Polymer P-9 (NORYL™ SA9000 resin, SABIC, Pittsfield, Mass. USA), PFP-1 and PFP-2. The weight percent remaining of the polymers at 400° C. based on the original weight and the temperatures at 5% and 10% weight loss of the polymers were determined. Polymers P-9, PFP-1 and PFP-2 exhibited significantly lower weight loss at 400° C. compared with the polystyrene. In addition, the temperatures at which 5% and 10% loss in weight occurred for Polymers P-9, PFP-1 and PFP-2 were significantly higher than those observed for the comparative polystyrene polymer.

TABLE 2

| Polymer | wt %, 400° C. | Temp. at 5% loss in weight (° C.) | Temp. at 10% loss in weight (° C.) |
|---|---|---|---|
| Polystyrene (Comp.) | 87.5 | 388 | 397 |
| P-9 | 97.8 | 415 | 425 |
| PFP-1 | 99.3 | 427 | 434 |
| PFP-2 | 98.9 | 478 | 506 |

What is claimed is:

1. A method of forming an electronic device, comprising:
(a) providing a semiconductor substrate comprising a porous feature on a surface thereof;
(b) applying a composition over the porous feature, wherein the composition comprises a polymer and a solvent, wherein the polymer comprises a repeat unit of the following general formula (I):

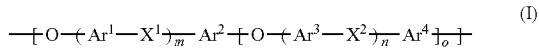

(I)

wherein: $Ar^1$, $Ar^2$, $Ar^3$ and $Ar^4$ independently represent an optionally substituted divalent aromatic group; $X^1$ and $X^2$ independently represent a single bond, —O—, —C(O)—, —C(O)O—, —OC(O)—, —C(O)NR$^1$—, —NR$^2$C(O)—, —S—, —SO$_2$— or an optionally substituted C$_{1-20}$ divalent hydrocarbon group, wherein R$^1$ and R$^2$ independently represent H or a C$_{1-20}$ hydrocarbyl group; m is 0 or 1; n is 0 or 1; o is 0 or 1; and m and o are not both 0; and
(c) heating the composition, wherein the polymer is disposed in pores of the porous feature.

2. The method of claim 1, wherein the polymer further comprises a divalent linking group within the polymer backbone.

3. The method of claim 2, wherein the divalent linking group is chosen from C$_{1-20}$ divalent fluorinated or non-fluorinated hydrocarbon groups, optionally containing —O— within the polymer backbone.

4. The method of claim 2, wherein the divalent linking group is chosen from groups of the following general formula (II):

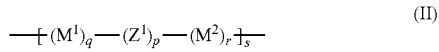

(II)

wherein: M$^1$ and M$^2$ are independently chosen from divalent aromatic groups and divalent aromatic oxide groups; Z$^1$ represents —C(R$^3$)(R$^4$)—, —O—, —C(O)—, —S(O)— or —Si(R$^5$)(R$^6$)—, wherein R$^3$ and R$^4$ are independently chosen from hydrogen, hydroxyl, C$_{1-5}$ alkyl and fluoroalkyl, and R$^5$ and R$^6$ are independently chosen from C$_{1-5}$ alkyl and fluoroalkyl and C$_{4-25}$ aryl and fluoroaryl; p is an integer from 0 to 5; q is 0 or 1; r is 0 or 1; p+q+r>0; and s is an integer from 1 to 50.

5. The method of claim 1, wherein the polymer further comprises an endcapping group that is free of hydroxyl groups.

6. The method of claim 5, wherein the endcapping group is an optionally substituted aromatic or aromatic oxide group.

7. The method of claim 1, wherein m is 0, o is 0 and Ar$^e$ represents optionally substituted phenylene.

8. The method of claim 1, wherein the porous feature comprises pores having a width of from 5 to 20 nm.

9. The method of claim 1, wherein the polymer exhibits a weight loss of less than 5% under nitrogen atmosphere at a temperature of 400° C. as determined by thermal gravimetric analysis at a heating rate of 10° C./min from room temperature.

10. The method of claim 1, further comprising: (d) removing the polymer from the pores.

11. The method of claim 5, wherein the endcapping group is chosen from the following:

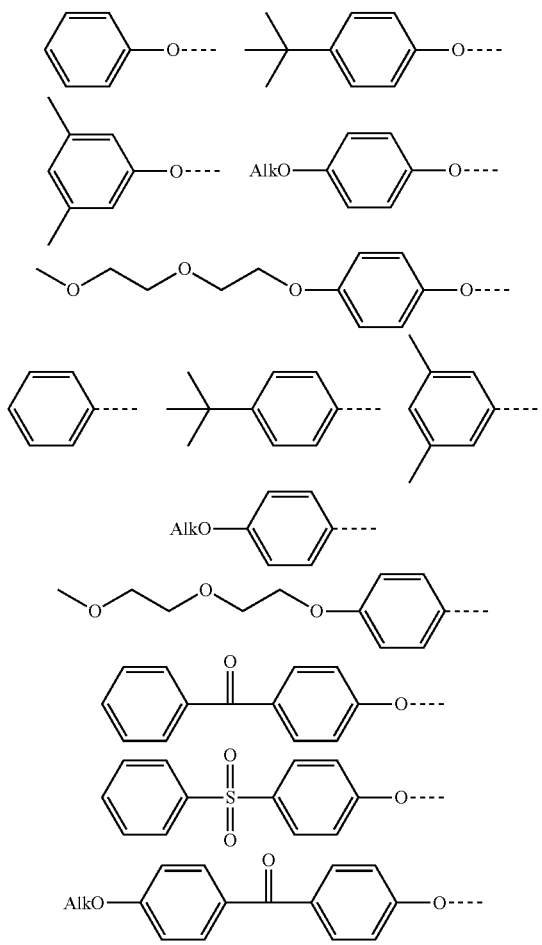

-continued

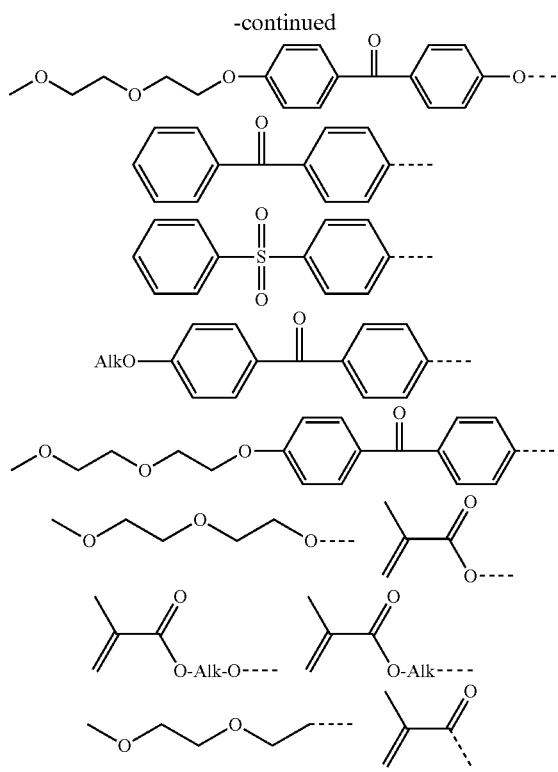

wherein "Alk" is an alkyl group or a fluoroalkyl group.

12. A method of forming an electronic device, comprising:
(a) providing a semiconductor substrate comprising a porous feature on a surface thereof;
(b) applying a composition over the porous feature, wherein the composition comprises a polymer and a solvent, wherein the polymer comprises:
a repeat unit of the following general formula (I):

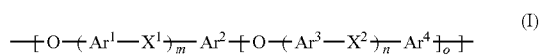

(I)

wherein: $Ar^1$, $Ar^2$, $Ar^3$ and $Ar^4$ independently represent an optionally substituted divalent aromatic group; $X^1$ and $X^2$ independently represent a single bond, —O—, —C(O)—, —C(O)O—, —OC(O)—, —C(O)NR$^1$—, —NR$^2$C(O)—, —S—, —S(O)—, —SO$_2$— or an optionally substituted $C_{1-20}$ divalent hydrocarbon group, wherein $R^1$ and $R^2$ independently represent H or a $C_{1-20}$ hydrocarbyl group; m is 0 or 1; n is 0 or 1; and o is 0 or 1; and
a divalent linking group within the polymer backbone; and
(c) heating the composition, wherein the polymer is disposed in pores of the porous feature.

* * * * *